United States Patent
Yamagishi

(10) Patent No.: US 12,500,100 B2
(45) Date of Patent: Dec. 16, 2025

(54) CONNECTED PROCESSING CONTAINER AND SUBSTRATE PROCESSING METHOD

(71) Applicant: TOKYO ELECTRON LIMITED, Tokyo (JP)

(72) Inventor: Takayuki Yamagishi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 475 days.

(21) Appl. No.: 17/984,607

(22) Filed: Nov. 10, 2022

(65) Prior Publication Data

US 2023/0154771 A1 May 18, 2023

(30) Foreign Application Priority Data

Nov. 18, 2021 (JP) ................. 2021-188159

(51) Int. Cl.
*H01L 21/67* (2006.01)

(52) U.S. Cl.
CPC .... *H01L 21/67161* (2013.01); *H01L 21/6719* (2013.01)

(58) Field of Classification Search
CPC .......... H01L 21/67161; H01L 21/6719; H01L 21/67103; H01L 21/67196; H01L 21/67742; H01L 21/67754; H01L 21/68742; H01L 21/67109; H01L 21/67173; H01L 21/67178; H01L 21/68

USPC ................. 206/454, 468, 710, 832; 118/715; 414/217

See application file for complete search history.

(56) References Cited

U.S. PATENT DOCUMENTS

| | | | |
|---|---|---|---|
| 7,335,277 B2 * | 2/2008 | Makino .............. | H01L 21/6719 156/345.31 |
| 7,407,358 B2 * | 8/2008 | Takahashi ......... | H01L 21/67742 414/217 |
| 2008/0236487 A1 * | 10/2008 | Hirano .............. | H01L 21/67017 29/25.01 |

FOREIGN PATENT DOCUMENTS

| | | |
|---|---|---|
| JP | 2017-069314 A | 4/2017 |
| KR | 10-2009-0017887 A | 2/2009 |
| KR | 10-2010-0064802 A | 6/2010 |

* cited by examiner

Primary Examiner — Luan K Bui
(74) Attorney, Agent, or Firm — Fenwick & West LLP

(57) ABSTRACT

There is provided a connected processing container comprising: a first processing container and a second processing container arranged side by side in a horizontal direction with a gap therebetween and respectively accommodating a substrate for vacuum processing; a first block portion fixed to the first processing container; a second block portion fixed to the second processing container and arranged side by side in the horizontal direction with respect to the first block portion; and a rail portion to which the first block portion and the second block portion are slidably connected, the rail portion being provided so as to straddle the first processing container and the second processing container.

11 Claims, 8 Drawing Sheets

CONNECTED PROCESSING CONTAINER AND SUBSTRATE PROCESSING METHOD

CROSS-REFERENCE TO RELATED APPLICATIONS

This application claims priority to Japanese Patent Application No. 2021-188159 filed on Nov. 18, 2021, the entire contents of which are incorporated herein by reference.

TECHNICAL FIELD

The present disclosure relates to a connected processing container and a substrate processing method.

BACKGROUND

In a manufacturing process of a semiconductor device, a semiconductor wafer (hereinafter referred to as a "wafer") as a substrate is stored in a processing container, and film formation processing, etching processing and the like accompanied by heating are performed on the wafers. Japanese Laid-open Patent Publication No. 2017-69314 discloses a substrate processing apparatus comprising a vacuum transfer chamber provided with a robot for transferring wafers, and a plurality of chambers which are connected to the vacuum transfer chamber and process wafers by heating and supplying processing gases. The plurality of chambers are connected so that two of them share sidewalls with each other, and the robot is configured to collectively transfer wafers to two such chambers with shared sidewalls.

SUMMARY

The present disclosure provides a technique capable of stably supporting connected processing containers and capable of suppressing displacement of a substrate transfer position due to thermal expansion.

In accordance with an aspect of the present disclosure, there is provided a connected processing container comprising: a first processing container and a second processing container arranged side by side in a horizontal direction with a gap therebetween and respectively accommodating a substrate for vacuum processing; a first block portion fixed to the first processing container; a second block portion fixed to the second processing container and arranged side by side in the horizontal direction with respect to the first block portion; and a rail portion to which the first block portion and the second block portion are slidably connected, the rail portion being provided so as to straddle the first processing container and the second processing container.

DETAILED DESCRIPTION

Figure 1:
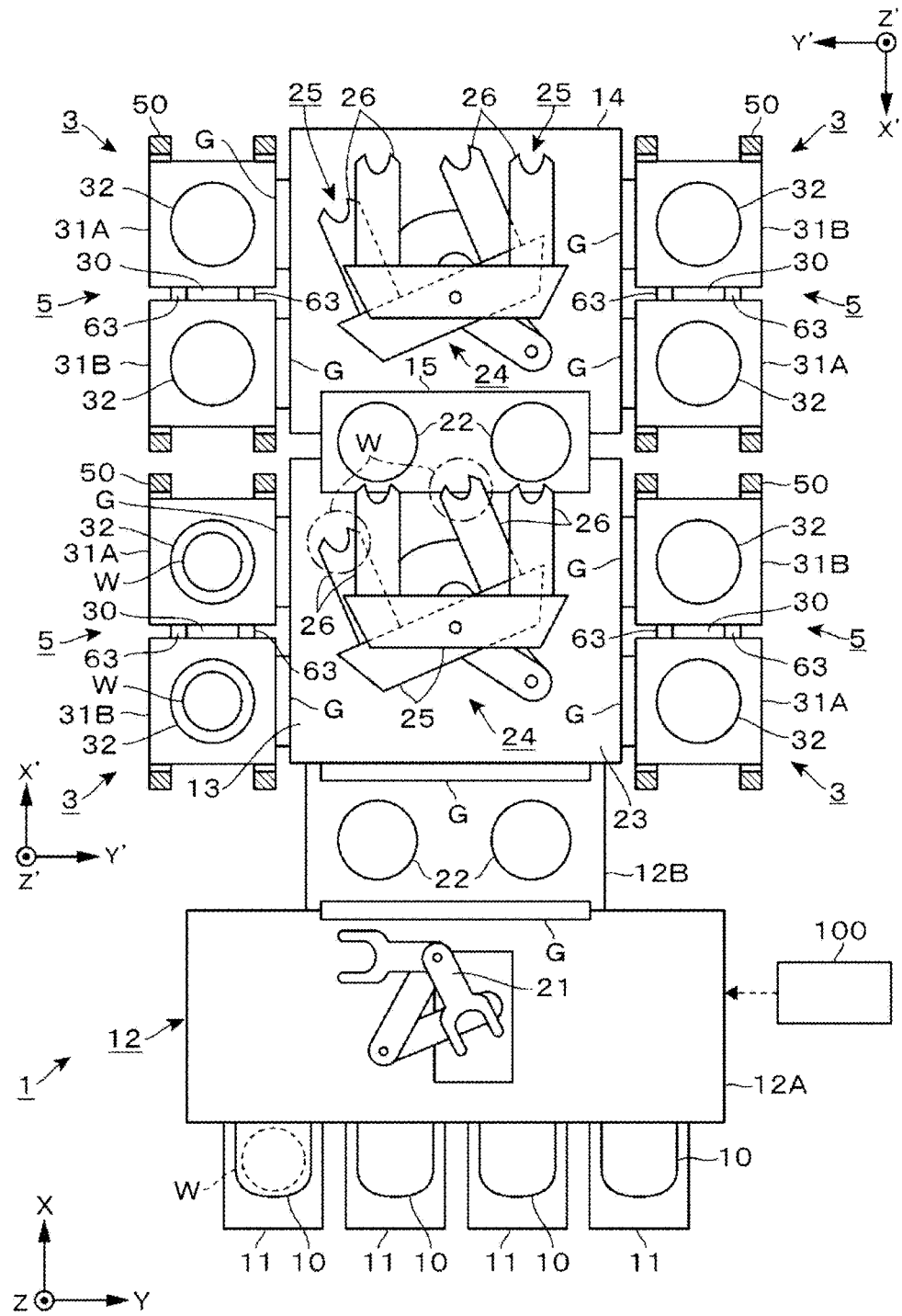
FIG. 1 is a plan view showing an example of a substrate processing system according to an embodiment of the present disclosure.

A substrate processing system 1 including a connected processing container 5 according to an embodiment of the present disclosure will be described with reference to the plan view of FIG. 1. First, the overview of the substrate processing system 1 will be described. The substrate processing system 1 includes a loading/unloading port 11, a loading/unloading module 12, vacuum transfer modules 13 and 14, a connection module 15, and a film forming module 3, and the connected processing container 5 is provided in the film forming module 3.

The connected processing container 5 includes a first processing container 31A and a second processing container 31B for respectively storing wafers W as substrates. These processing containers 31A and 31B are arranged side by side so as to form a gap 30 and are connected to each other. In the substrate processing system 1, a transfer mechanism transfers the wafers W collectively into the processing containers 31A and 31B constituting the connected processing container 5, and film formation processing is collectively performed on two wafers W in the processing containers 31A and 31B under the same processing conditions.

Each part of the substrate processing system 1 will be described below with reference to FIG. 1. In FIG. 1, description will be made on the assumption that an X direction is the front-rear direction and a Y direction orthogonal to the X direction is the horizontal direction. Four loading/unloading ports 11 are respectively connected to the loading/unloading module 12, and a transfer container 10 storing the wafer W is placed on each loading/unloading port 11. The loading/unloading ports 11, the loading/unloading module 12, the vacuum transfer module 13, the connection module 15, and the vacuum transfer module 14 are provided in this order along the X direction. Two film forming modules 3 are connected having the vacuum transfer module 13 on the front side disposed therebetween in the Y direction. Further, two film forming modules 3 are connected having the vacuum transfer module 14 on the rear side disposed therebetween in the Y direction.

The loading/unloading module 12 includes a normal pressure transfer chamber 12A and a load lock chamber 12B. The normal pressure transfer chamber 12A has an atmospheric atmosphere and includes a transfer mechanism 21, which is a multi joint arm that can move up and down, to transfer the wafers W between the transfer container 10 and the load lock chamber 12B. The load lock chamber 12B is configured such that an atmosphere in which the wafer W is placed can be switched between an air atmosphere and a vacuum atmosphere and includes two mounting portions 22 arranged in the Y direction. The transfer mechanism 21 of the normal pressure transfer chamber 12A is configured to transfer the wafers W between the two mounting portions 22 and the transfer container 10 and to transfer the wafers W one by one to the two mounting portions 22.

The vacuum transfer modules 13 and 14 are formed identically to each other. These vacuum transfer modules 13 and 14 include a vacuum transfer chamber 23 in which a vacuum atmosphere is formed, and a transfer mechanism 24 is provided in the vacuum transfer chamber 23. The transfer mechanism 24 is composed of a multi joint arm that can be raised and lowered, and an end effector 25 that forms the tip of the multi joint arm includes two holders 26 that are separated from each other. Since each holder 26 holds the wafers W one by one, the transfer mechanism 24 can collectively transfer two wafers W at a predetermined interval. For example, two end effectors 25 are provided vertically apart. One end effector 25 can receive the wafer W from the module and the other end effector 25 can transfer the wafer W to the module.

The connection module 15 is a module on which the wafer W is placed in order to transfer the wafer W between the vacuum transfer modules 13 and 14, and the inside thereof is a vacuum atmosphere. The connection module 15 is provided with two mounting portions 22 arranged in the Y direction, similarly to the load lock chamber 12B. In addition, the interval between the two mounting portions 22 in each of the load lock chamber 12B and the connection module 15 corresponds to the interval between the holders 26 of the transfer mechanism 24 so that the transfer mechanism 24 can collectively transfer the wafers W. The mounting portion 22 includes, for example, substrate supporting portions such as pins that support a plurality of positions apart from the center of the wafer W and separated in the circumferential direction of the wafer W so that the wafer W is transferred by the lifting operation of the transfer mechanisms 21 and 24.

A gate valve G is interposed between the normal pressure transfer chamber 12A and the load lock chamber 12B, between the load lock chamber 12B and the vacuum transfer module 13, and between the processing containers 31A and 31B constituting the film forming module 3 and the vacuum transfer modules 13 and 14, respectively. The gate valve G opens and closes a transfer port for the wafers W provided in each module, and thus the atmosphere in each module is maintained at the above-mentioned atmosphere.

A controller 100 is provided in this substrate processing system 1. The controller 100 is configured by a computer and has a program. In this program, a group of steps (instructions) is organized such that the operation of each component of the substrate processing system 1 is controlled and transfer of the wafer W and film formation processing, which will be described layer, are performed by outputting a control signal to each component of the substrate processing system 1. The program is stored in a storage of the computer, for example, a flexible disk, a compact disk, a hard disk, a magneto-optical disk (MO), a non-volatile memory, or the like, read from this storage, and installed in the controller 100.

In the substrate processing system 1 described above, the wafer W is transferred from the transfer container 10 to the film forming module 3 connected to the vacuum transfer module 13 or the vacuum transfer module 14 and processed, and then returned to the transfer container 10. Therefore, one transfer path is a path through which the wafer W is transferred in the order of the transfer container 10→the normal pressure transfer chamber 12A→the load lock chamber 12B→the vacuum transfer module 13→the film forming module 3→the vacuum transfer module 13→the load lock chamber 12B→the normal pressure transfer chamber 12A→the transfer container 10. In another transfer path, the wafer W is transferred in the order of the transfer container 10→the normal pressure transfer chamber 12A→the load lock chamber 12B→the vacuum transfer module 13→the connection module 15→the vacuum transfer module 14→the film forming module 3. Thereafter, the wafer W is transferred from the film forming module 3 in the order of the vacuum transfer module 14→the connection module 15→the vacuum transfer module 13→the load lock chamber 12B→the normal pressure transfer chamber 12A→the transfer container 10.

Two wafers W are collectively transferred in a section where transfer by the transfer mechanism 24 is performed on each of the transfer paths described above. Accordingly, two wafers W are collectively transferred between the film forming module 3 including the processing containers 31A and 31B and the vacuum transfer modules 13 and 14. In addition, two wafers W are collectively transferred as well between the load lock chamber 12B and the vacuum transfer module 13, between the vacuum transfer module 13 and the connection module 15, and between the connection module 15 and the vacuum transfer module 14.

Next, the film forming module 3 including the connected processing container 5 of the present disclosure will be described. The film forming module 3 includes the connected processing container 5 including the processing containers 31A and 31B, a gas supply source 39, an exhaust mechanism 40, and a gas supply device 42, and is configured to perform processing of forming a titanium nitride film (TiN film) on the wafer W, for example. In the connected processing container 5, the first processing container 31A and the second processing container 31B are arranged side by side in the horizontal direction so that the gap 30 is formed therebetween. The processing containers will be described below. However, since the first and second processing containers 31A and 31B are configured in the same manner, the first processing container 31A will be described as a representative using the schematic diagram of FIG. 2. The processing container 31A includes a stage 32, sidewall heaters 33, lifting pins 34, a lifting mechanism 35, and a shower head 41. In the figures showing the connected processing container 5 such as FIG. 2, description will be made on the assumption that an X' direction is the horizontal direction, a Y' direction is the front-rear direction, and a Z' direction is the vertical direction using the sub-coordinate shown in FIG. 1.

The sidewall heater 33 constitutes a heating portion for heating the first processing container 31A and is embedded in the sidewall of the processing container 31A. In addition, the stage 32 is circular in a plan view, and the position thereof in the horizontal direction is fixed within the processing container 31A. A stage heater 36 for heating and processing the wafer W is embedded in the stage 32. Three lifting pins 34 (only two are shown in the figure) are provided so as to protrude from the upper surface of the stage 32 by the lifting mechanism 35. Due to the lifting operation of the lifting pins 34, the wafer W is transferred between the stage 32 and the aforementioned transfer mechanism 24 which has moved to a predetermined transfer position within the processing container 31A. P in the figure indicates the center of the stage 32, and the wafer W is placed on the stage 32 so that the center of the wafer W is aligned with the center P.

The shower head 41 is provided on the ceiling of the processing container 31A, and a film forming gas is supplied to the shower head 41 from the gas supply source 39 common to the processing containers 31A and 31B via the gas supply device 42 including a valve and the like, for example. Further, one end of an exhaust pipe 38 is connected to the processing container 31A, and the other end of the exhaust pipe 38 is connected to the exhaust mechanism 40 common to the processing containers 31A and 31B. The exhaust mechanism 40 includes, for example, a vacuum pump or the like.

Figure 3:
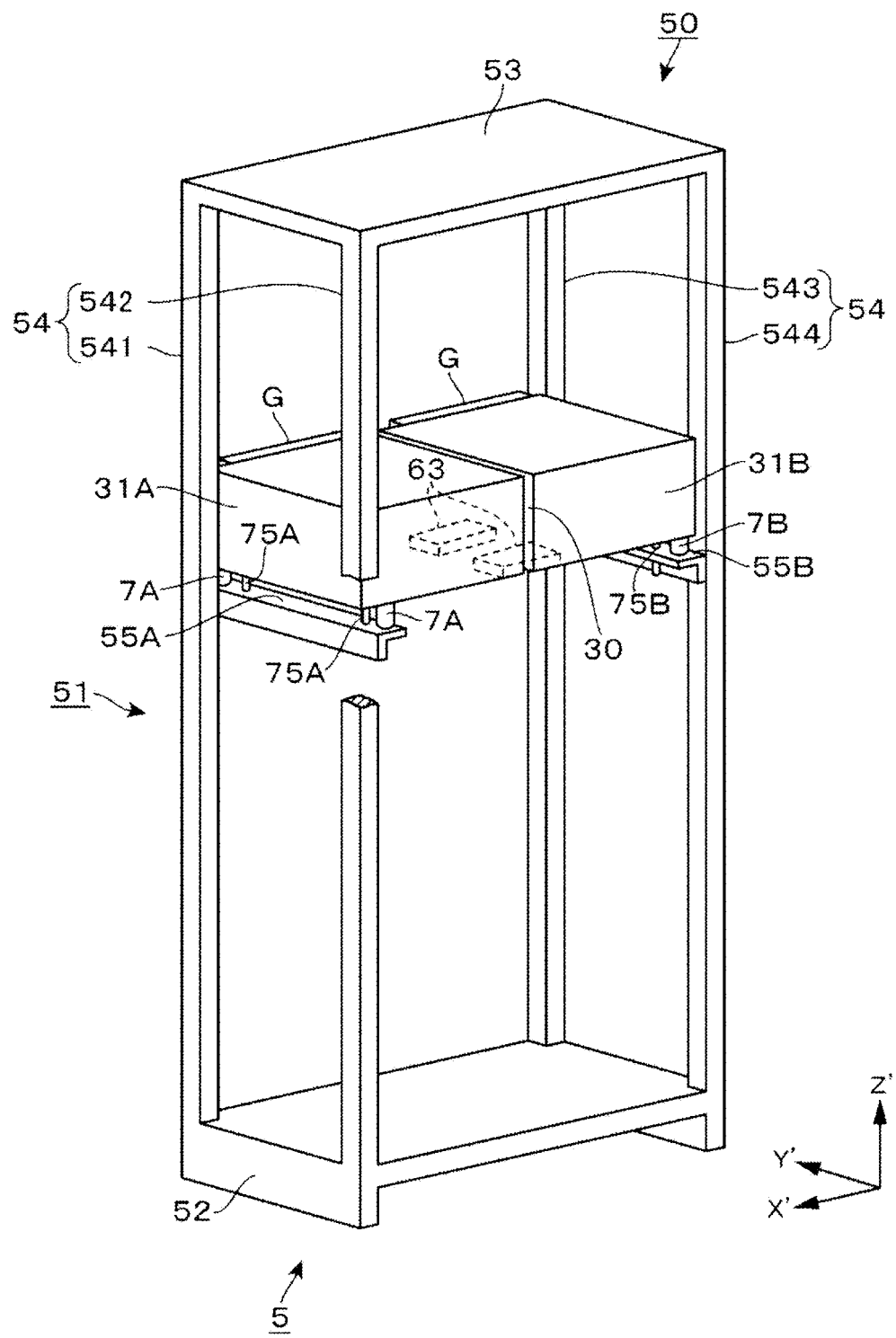
FIG. 3 is a rear-side perspective view showing an example of the connected processing container.
Figure 4:
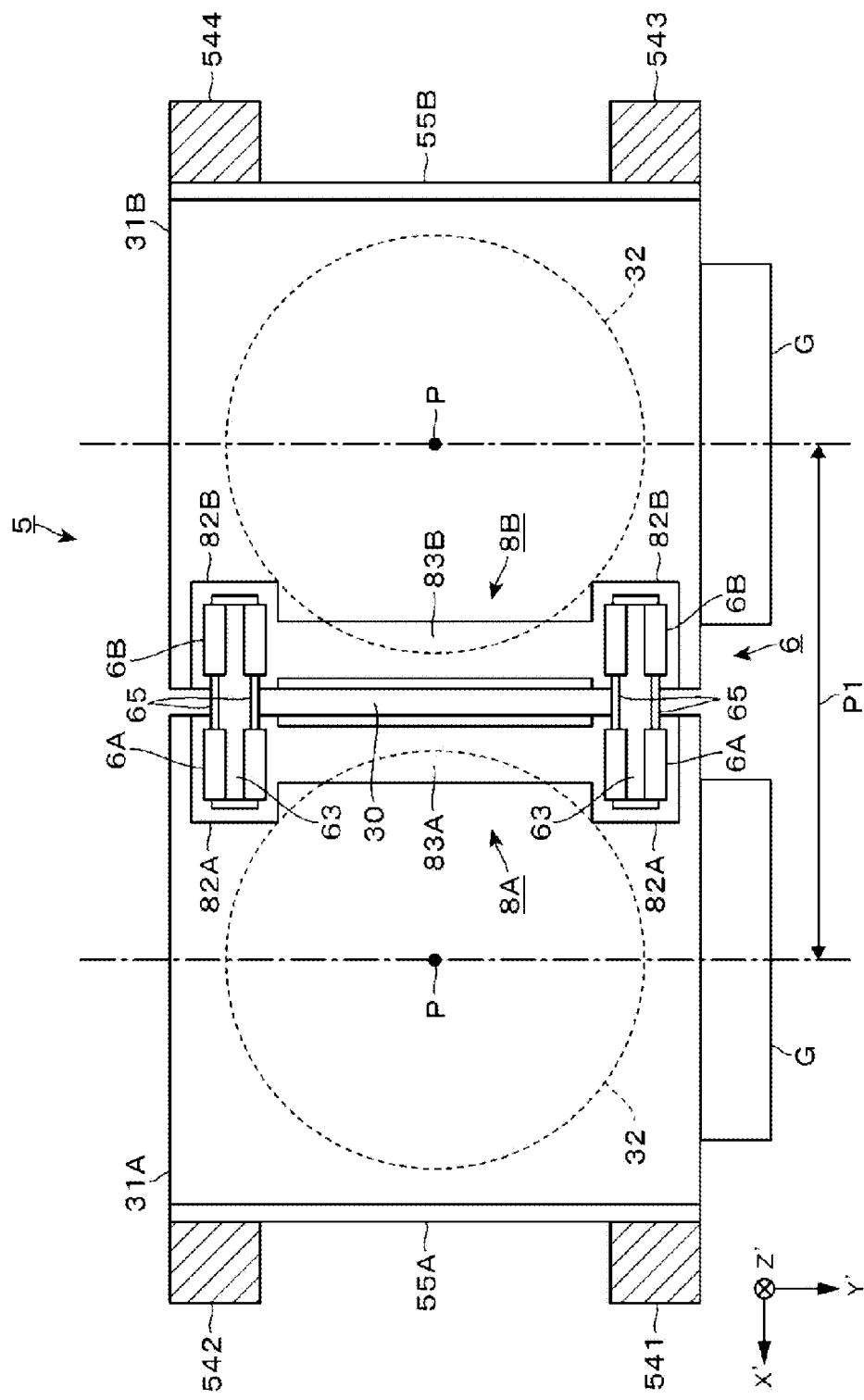
FIG. 4 is a bottom view showing the first processing container and the second processing container.

Next, the overall configuration of the connected processing container 5 will be described. As described above, the connected processing container 5 includes the first processing container 31A and the second processing container 31B. In addition to these processing containers 31A and 31B, the connected processing container 5 includes a supporting portion 50 for supporting the processing containers 31A and 31B and a connection portion 6 for connecting the processing containers 31A and 31B. In describing the connected processing container 5, FIGS. 2 to 4 will be referred to, and the direction in which the gate valve G is provided will be referred to as the front side. FIG. 3 is a rear perspective view of the connected processing container 5 with the gate valve G facing the vacuum transfer module 13, and FIG. 4 is a bottom view of the connected processing container 5. In addition, in correspondence with the description of FIG. 3, the left side and the right side in the following description are the left side and the right side when viewed from the rear to the front, and the processing container 31A is positioned on the left side and the processing container 31B is positioned on the right side, respectively. P1 in FIG. 4 and the like indicates a distance between the centers P of the stages 32 (pitch between the stages 32) of the processing containers 31A and 31B.

The first processing container 31A and the second processing container 31B are formed in a rectangular shape, and are separated from each other without sharing sidewalls. These processing containers 31A and 31B are disposed at the same height, and the right sidewall of the processing container 31A and the left sidewall of the processing container 31B face each other with the gap 30 interposed therebetween. Each front surface of the processing containers 31A and 31B is fixed to the vacuum transfer module 13 or 14 via the gate valve G. The dimension (width in the horizontal direction (X' direction)) of the gap 30 is, for example, 2 mm to 6 mm, more specifically 4 mm when the processing containers 31A and 31B are at room temperature (20° C. to 25° C.), and in FIGS. 2 to 4, the gap 30 is exaggeratedly drawn large.

The supporting portion 50 is provided on a floor on which the substrate processing system 1 is installed, supports the processing containers 31A and 31B above the floor, and includes a frame 51. The frame 51 includes a bottom portion 52, a horizontal upper plate 53, and four vertical strut portions 54 (541 to 544) connecting the bottom portion 52 and the upper plate 53. The bottom portion 52 is provided directly above the floor, and the upper plate 53 is provided above the processing containers 31A and 31B. Two strut portions 541 and 542 of the four strut portions 54 are provided on the left side of the processing container 31A and separated from each other in the front-rear direction, and the other two strut portions 543 and 544 are provided on the right side of the processing container 31B and separated from each other in the front-rear direction. Accordingly, if the processing containers 31A and 31B are regarded as a set of processing containers, the strut portions 54 (541 to 544) are provided so as to surround this set. Each strut portion 54 is disposed to be spaced apart from each sidewall of the processing containers 31A and 31B.

A base portion 55A for supporting the first processing container 31A is provided between the strut portions 541 and 542, and a base portion 55B for supporting the second processing container 31B is provided between the strut portions 543 and 544. These base portions 55A and 55B are composed of bar-shaped horizontal members extending along the front-rear direction (Y' direction) under the processing containers 31A and 31B. The base portions 55A and 55B in this example are formed by bending the short sides of elongated plate members into a substantially L-shape and include horizontal members and vertical members extending downward. For example, the front end side and the rear end side of the vertical members are attached to the strut portions 54 ((541, 542) and (543, 544)), respectively.

Figure 5:
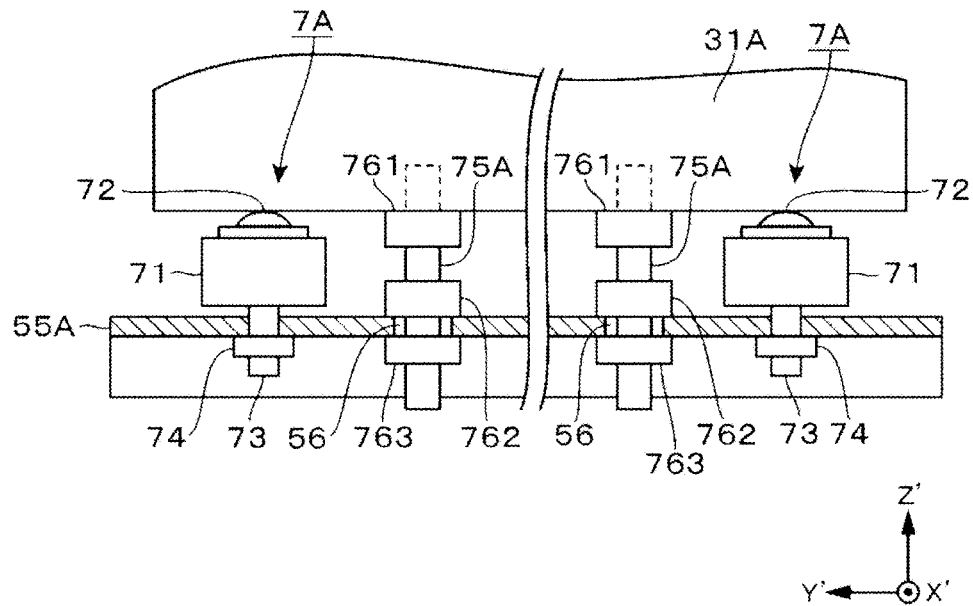
FIG. 5 is a schematic side view showing the bottom of the first processing container.

Ball casters 7A and 7B are interposed between the base portions 55A and 55B and the processing containers 31A and 31B, respectively. The ball casters 7A and 7B, as shown in FIG. 5 with the ball caster 7A as an example, consist of a main body 71 provided with a ball receiving portion and a ball portion 72 partially exposed upward from the main body 71 and rotatably held by the main body 71. The main body 71 is attached to the base portions 55A and 55B with a screw 73 and a nut 74.

The ball casters 7A and 7B support the processing containers 31A and 31B with their respective ball portions 72 in contact with the bottoms of the processing containers 31A and 31B. For example, the processing containers 31A and 31B are provided with the ball casters 7A and 7B on the front side and the rear side, respectively, and one processing container 31A (31B) is supported by two ball casters 7A (7B). In this manner, the processing containers 31A and 31B are supported by the frame 51 via the base portions 55A and 55B and the ball casters 7A and 7B at horizontal end positions on the opposite sides of the gap 30 as viewed from the processing containers 31A and 31B.

Thus, only the left end of the first processing container 31A and only the right end of the second processing container 31B are supported. For this reason, the bottom portions of the processing containers 31A and 31B, except for the portions in contact with the ball casters 7A and 7B, are floated in the air, and a large space is formed between the bottom portions of the processing containers 31A and 31B and the bottom portion 52 of the frame 51. In this space, for example, a facility (gas box) including the gas supply device 42 for distributing the film forming gas supplied from the gas supply source 39 to the processing containers 31A and 31B, and electrical component for operating each film forming module 3 are stored. Furthermore, the bottom portions of the processing containers 31A and 31B are floated so as not to apply a load to the gas box and the electrical component.

Figure 6:
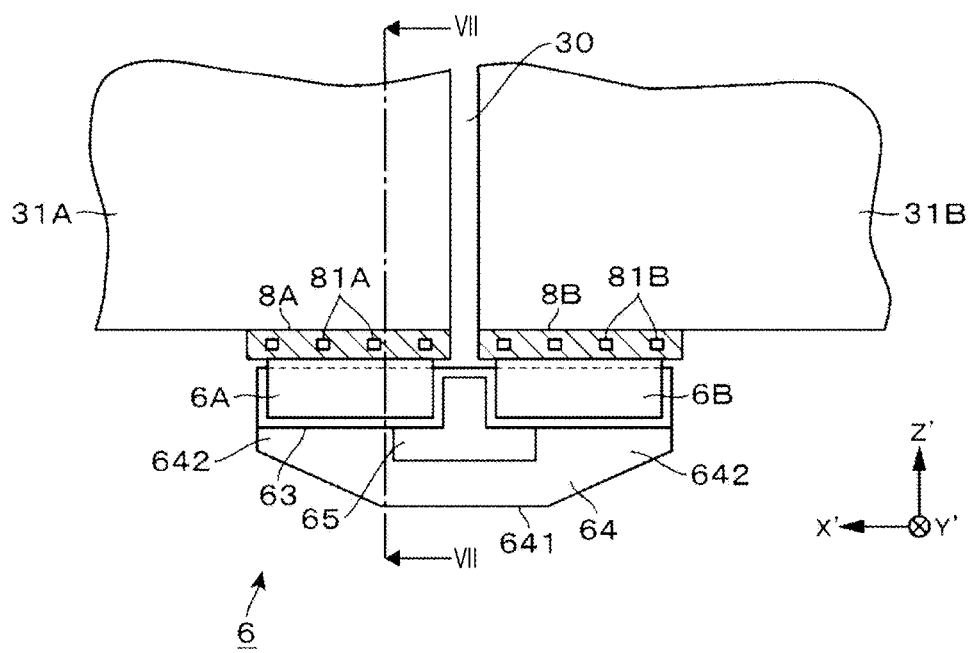
FIG. 6 is a side view showing a part of the first processing container and the second processing container.
Figure 7:
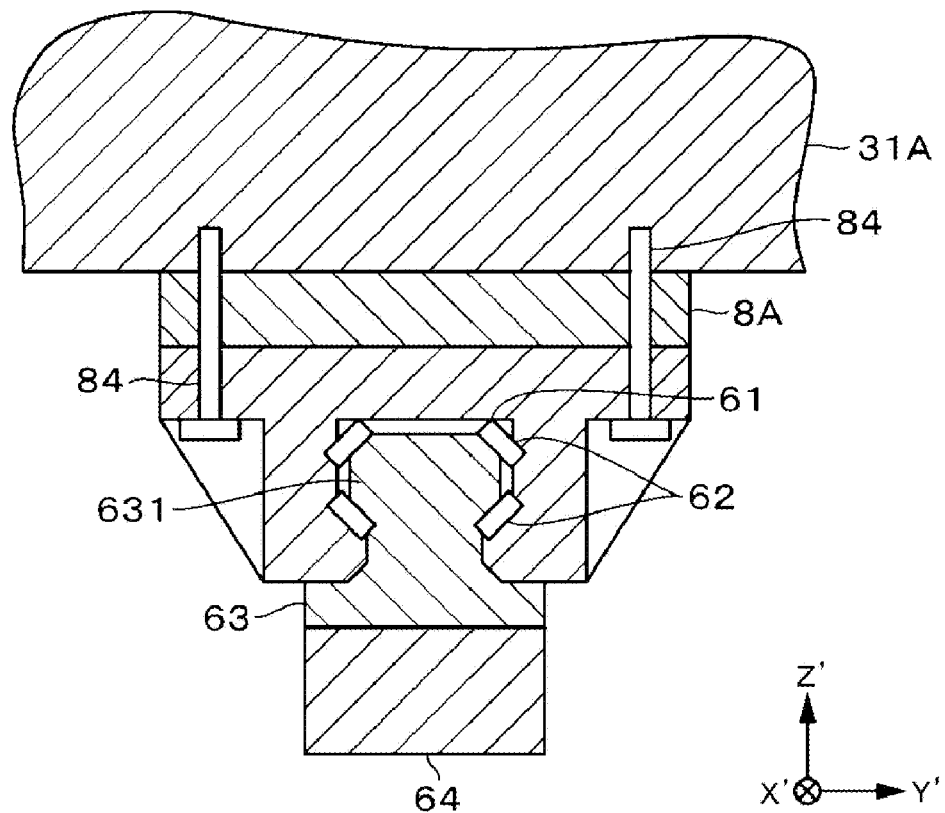
FIG. 7 is a longitudinal side view showing a first block portion and a rail portion.

Next, the connection portion 6 that connects the first processing container 31A and the second processing container 31B via the gap 30 will be described with reference to FIGS. 6 and 7 as well. FIG. 6 is a side view showing the connection portion 6 and FIG. 7 is a vertical sectional view taken along line VII-VII in FIG. 6.

The connection portion 6 includes a first block portion 6A fixed to the first processing container 31A, a second block portion 6B fixed to the second processing container 31B, and a rail portion 63 to which the first block portion 6A and the second block portion 6B are slidably connected.

The first block portion 6A is provided at the bottom portion near the right sidewall of the first processing container 31A, and the second block portion 6B is provided at the bottom portion near the left sidewall of the second processing container 31B. The first block portion 6A and the second block portion 6B are arranged side by side in the horizontal direction (X' direction) with the gap 30 interposed therebetween.

Figure 2:
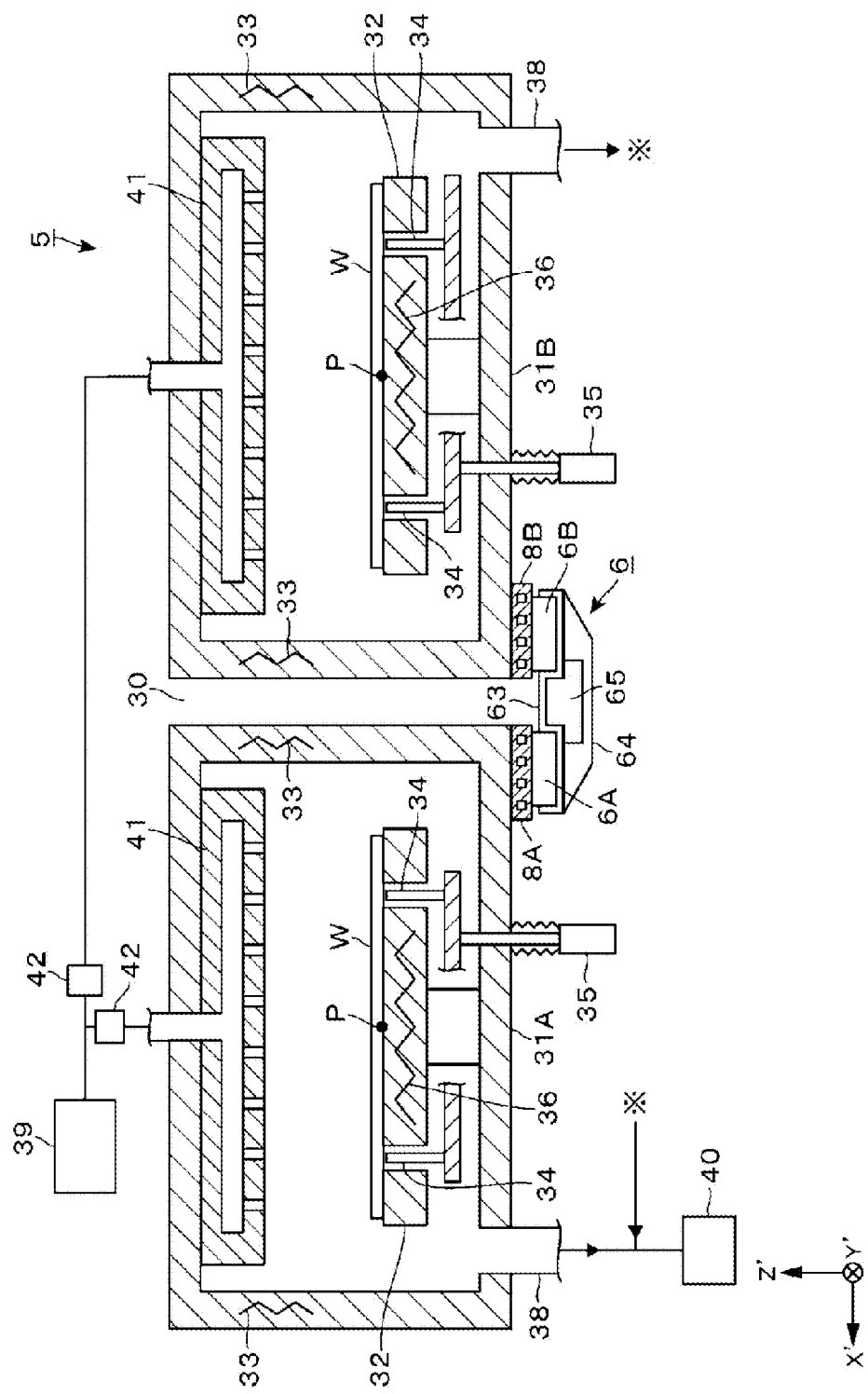
FIG. 2 is a longitudinal side view showing an example of a first processing container and a second processing container forming a connected processing container provided in the substrate processing system.

As shown in FIGS. 2, 4, and 6, the rail portion 63 is provided so as to straddle the processing container 31A and the processing container 31B and extend horizontally below the processing containers 31A and 31B. A set of the first block portion 6A, the second block portion 6B, and the rail portion 63 constitutes the connection portion 6, and as shown in FIG. 4, the set is provided at two positions on the front side and the rear side of the processing containers 31A and 31B.

The first block portion 6A and the second block portion 6B have, for example, a planar upper surface, and as shown in FIG. 7 by taking the first block portion 6A as an example, a concave portion 61 having a substantially rectangular vertical cross section is formed at the bottom portion thereof. On the other hand, the rail portion 63 is provided with a convex portion 631 having a shape corresponding to the concave portion 61 and the convex portion 631 is fitted into the concave portion 61.

Rolling members 62 composed of, for example, a roller or a ball is provided at a contact portion between the convex portion 631 of the rail portion 63 and the concave portions 61 of the block portions 6A and 6B. In this example, the convex portion 631 of the rail portion 63 has a substantially rectangular vertical cross section, and the rolling members 62 are respectively provided at four corners of the convex portion 631 where the rail portion 63 and the block portions 6A and 6B are in contact with each other.

The rolling member 62 of this example is formed, for example, so that a large number of rollers each having a rotating shaft tilted with respect to a vertical axis are arranged in a circular pattern in the length direction (X' direction) of the block portions 6A and 6B and the rollers rotate when the block portions 6A and 6B slide on the rail portion 63. As the rolling members 62 rotate between the block portions 6A and 6B and the rail portion 63 in this manner, the friction coefficient between the block portions 6A and 6B and the rail portion 63 is reduced, and sliding movement is smoothly performed.

The connection portion 6, which is a set of the first block portion 6A, the second block portion 6B, and the rail portion 63, is commercially available as a component called "linear guide" and the like.

The first block portion 6A and the second block portion 6B are fixed to the first processing container 31A and the second processing container 31B via cooling plates 8A and 8B constituting cooling portions, respectively. As shown in FIGS. 2, 4, and 6, the cooling plates 8A and 8B are made of, for example, stainless steel plate-like bodies in which cooling medium flow paths 81A and 81B are formed. In this example, regions 82A and 82B interposed between the processing containers 31A and 31B and the block portions 6A and 6B are formed in the cooling plates 8A and 8B. These regions 82A and 82B are larger than the upper surfaces of the block portions 6A and 6B in a plan view, and are formed in a shape capable of covering the upper surfaces. Further, as shown in FIG. 4, the cooling plates 8A and 8B are provided with regions 83A and 83B extending along the front-rear direction (Y' direction). These regions 83A and 83B serve to connect the regions 82A and 82B corresponding to the front block portions 6A and 6B and the regions 82A and 82B corresponding to the rear block portions 6A and 6B.

As shown in FIG. 7 using the first processing container 31A as an example, the cooling plates 8A and 8B are provided so as to be interposed between the block portions 6A and 6B and the bottom portions of the processing containers 31A and 31B and are fixed by screws 84. On the other hand, the rail portion 63 is not fixed to the processing containers 31A, 31B, and is supported in a suspended state from the block portions 6A and 6B when viewed from the processing containers 31A and 31B. For this reason, the lower ends of the block portions 6A and 6B are configured to extend inward and wrap around to the lower surface side of the convex portion of the rail portion 63 to prevent the rail portion 63 from falling.

A rib 64 is provided along the bottom surface of the rail portion 63, which is a surface opposite to the surface on which the first block portion 6A and the second block portion 6B slide. The rib 64 is made of, for example, stainless steel, and is fixed to the rail portion 63 by a screw which is not shown, for example. Further, as shown in FIG. 6, the rib 64 is formed so that a central portion 641 in the length direction (X' direction) is thicker than both end portions 642. The central portion 641 is a region including a portion facing the region where the gap 30 is formed.

Further, the connection portion 6 is provided with a stop member 65 for preventing the rail portion 63 from slipping out of the first block portion 6A and the second block portion 6B. The stop member 65 in this example is attached to the central portion 641 of the front surface and the rear surface of the rib 64, for example.

Furthermore, the first processing container 31A and the second processing container 31B are provided with height adjusting members 75A and 75B for adjusting the height position from the base portions 55A and 55B. As shown in FIGS. 3 and 5, two height adjusting members 75A and 75B are provided for each of the first and second processing containers 31A and 31B, for example. For example, the height adjusting members 75A and 75B are arranged inside the two ball casters 7A and 7B in the Y' direction, respectively. FIG. 5 shows the positional relationship between the ball caster 7A and the height adjusting member 75A on the side of the first processing container 31A.

The height adjusting members 75A and 75B extend vertically, and are rod-shaped members formed with a feed screw capable of adjusting the height position by nuts for positioning. The lower ends (base portion sides) of the height adjusting members 75A and 75B penetrate through holes 56 provided in the base portions 55A and 55B, while the upper ends thereof are inserted into the bottom portions of the processing containers 31A and 31B. The through holes 56 have an opening diameter greater than that of the height adjusting members 75A and 75B, and nuts 761, 762, and 763 for positioning are provided in order from the upper side to the lower side.

The adjustment of the height positions of the processing containers 31A and 31B is performed while the processing container 31 is supported on the nut 761. By adjusting the positions of the lower surfaces of the processing containers 31A and 31B with the nuts 762 and 763 of the height adjusting member 75, the height positions of the processing containers 31A and 31B are adjusted.

After the adjustment of the height positions is completed, the height positions of the ball casters 7A and 7B are adjusted, the processing containers 31A and 31B are supported by these ball casters 7A and 7B, and then the nuts 762 and 763 are loosened. The height adjusting member 75 is suspended from the lower surfaces of the processing containers 31A and 31B while the wafer W is being processed, with the upper ends thereof inserted into the processing containers 31A and 31B.

In the film forming module 3 provided with the connected processing container 5 described above, the wafers W can be collectively transferred to the first processing container 31A and the second processing container 31B by the transfer mechanism 24 on the side of the vacuum transfer modules 13 and 14. Thereafter, vacuum processing is performed on the wafers W stored in these processing containers 31A and 31B. In the film forming module 3, while the substrate processing system 1 is in operation, the inside of the processing containers 31A and 31B is adjusted to a vacuum atmosphere with a preset pressure by the exhaust mechanism 40 and in order to process the placed wafers W at an arbitrary processing temperature, the stage 32 is heated to the processing temperature by the stage heater 36.

In addition, the sidewall of the processing container 31A is heated by the sidewall heater 33 to a temperature corresponding to the processing temperature so that the reactivity of film forming gas supplied into the processing container 31A is ensured. For example, the temperature of the sidewall in forming the TiN film is 170° C. as an example. In a state where such a vacuum atmosphere is formed and heating is performed by each heater, the film forming gas is supplied from the shower head 41 to the wafer W placed on the stage 32 to perform a film forming process of the TiN film, which is vacuum processing.

Then, as will be described later, when thermal expansion and/or thermal contraction occur in each of the first processing container 31A and the second processing container 31B, at least one of the first block portion 6A and the second block portion 6B is slid horizontally with respect to the rail portion 63.

Next, the operation of the connected processing container 5 will be described. First, the reason for providing the gap 30 between the sidewalls of the processing containers 31A and 31B will be described. When the wafer W is processed as described above, the processing containers 31A and 31B are heated by the sidewall heater 33 to a temperature corresponding to the processing temperature of the wafer W. For example, the sidewalls are heated to a temperature within the range of 50° C. to 170° C. depending on the processing temperature of the wafer W. The sidewalls then thermally expand according to their temperature.

A configuration in which the sidewalls of the processing containers 31A and 31B are coupled without the gap 30 between the processing containers 31A and 31B, in other words, a configuration in which the sidewalls are shared between the processing containers as described in Japanese Laid-open Patent Publication No. 2017-69314 is assumed. Assuming that the sidewalls of the processing containers 31A and 31B are coupled in this manner, the pitch P1, which is the interval between the centers of the stages 32, fluctuates depending on the amount of thermal expansion of the processing containers 31A and 31B. The higher the temperature of the walls of the processing containers 31A and 31B, the larger the pitch P1. That is, since the sidewalls of the processing containers 31A and 31B are coupled to each other, the sidewalls press against each other due to thermal expansion, and the horizontal center of the processing container 31A is displaced to the left and the horizontal center of the processing container 31B is displaced to the right, thereby increasing the pitch P1.

On the other hand, the vacuum transfer modules 13 and 14 are kept at room temperature, the distance between the two holders 26 of the transfer mechanism 24 is constant, and the two wafers W are always transferred by the transfer mechanism 24 to the processing containers 31A and 31B with a constant interval therebetween. Accordingly, when the pitch P1 between the centers P of the two stages 32 increases due to change in the temperature of the sidewalls of the processing containers 31A and 31B, the wafer W is transferred to a position where the center of the wafer W is off the center P of the stage 32. Further, the front side of the processing containers 31A and 31B is fixed to the vacuum transfer module 13 via the gate valve G. For this reason, when the sidewalls of the processing containers 31A and 31B are coupled to each other, a large amount of thermal expansion causes a large amount of stress to be applied to the processing containers 31A and 31B. As a result, the processing containers 31A and 31B may be distorted. The above-mentioned Japanese Laid-open Patent Publication No. 2017-69314 does not describe the problem of thermal expansion of the processing container, and cannot solve the problem.

Therefore, in the connected processing container 5, as described above, the sidewalls of the processing containers 31A and 31B are separated from each other and the gap 30 is provided. Accordingly, even if the amount of thermal expansion of the processing containers 31A and 31B fluctuates, the horizontal positions of the sidewalls facing each other of the processing containers 31A and 31B can be changed. That is, even if the amount of thermal expansion of the processing containers 31A and 31B is large, the sidewalls do not interfere with each other because their positions are displaced on the gap 30 side. Therefore, fluctuation in the pitch P1 due to thermal expansion is suppressed.

The connection portion 6 is provided to connect the processing containers 31A and 31B via the gap 30, and while absorbing expansion and contraction due to thermal expansion and/or thermal contraction of the processing containers 31A and 31B, as will be described later, tinting at the gap 30 between the processing containers 31A and 31B is suppressed.

Figure 8:
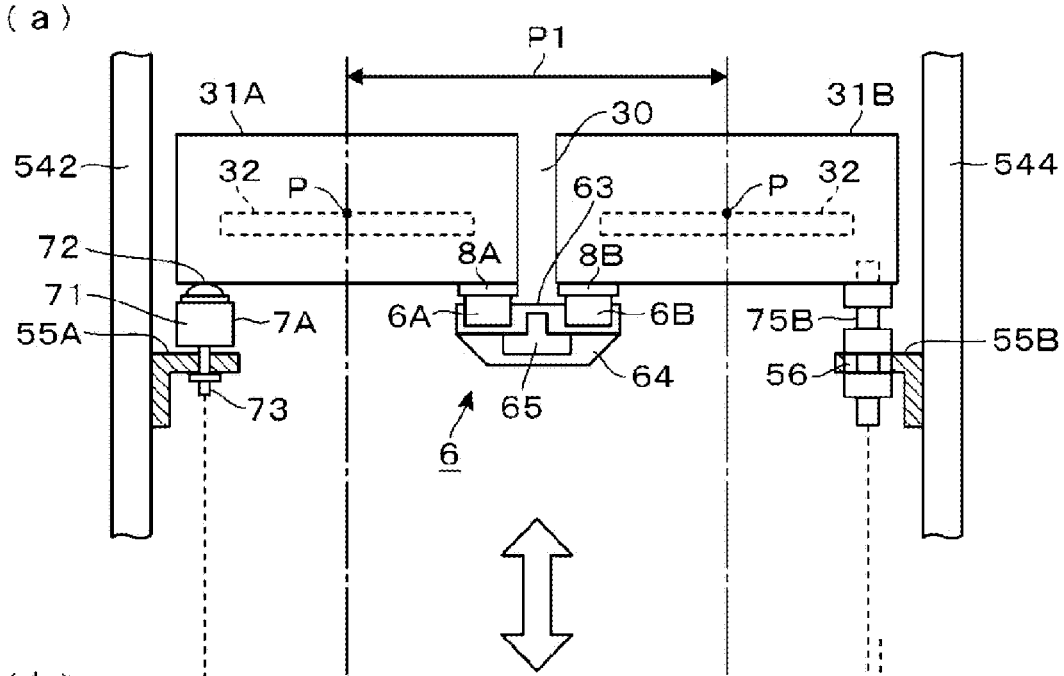
FIG. 8 is a longitudinal sectional view for explaining change in a gap between the first processing container and the second processing container.
Figure 8:
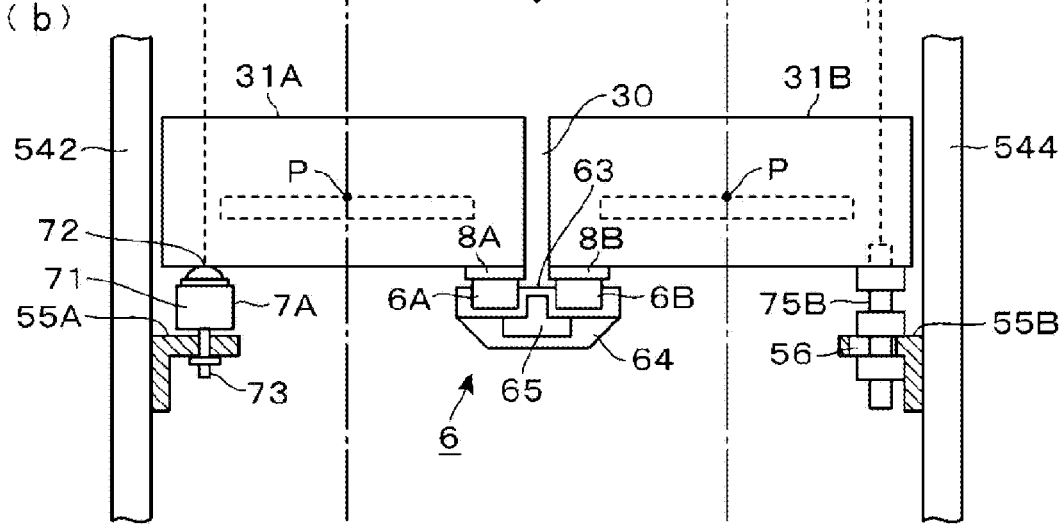
Figure 9:
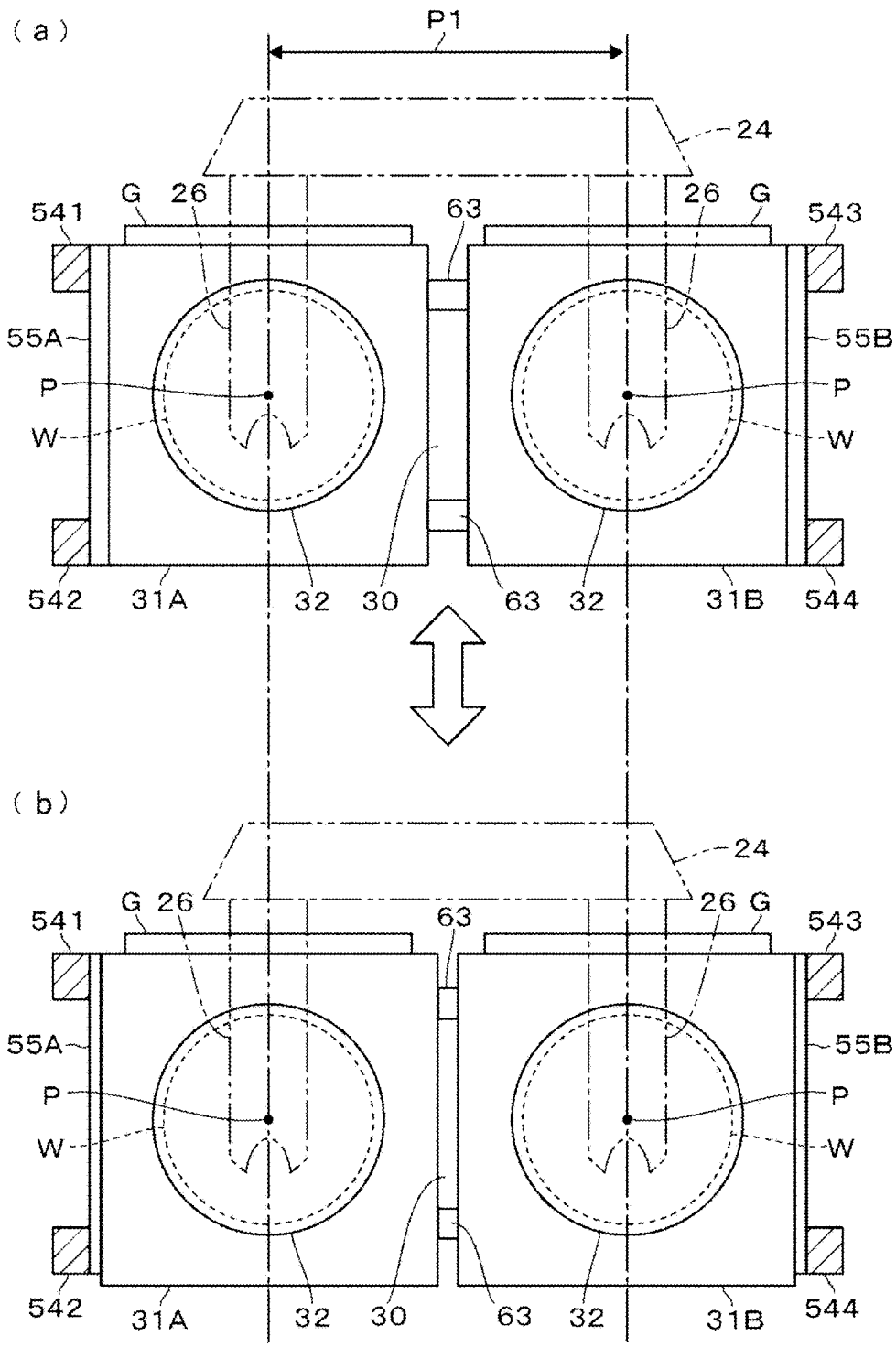
FIG. 9 is a plan view for explaining change in the gap between the first processing container and the second processing container.

Next, referring to the vertical side view of FIG. 8 and the plan view of FIG. 9, the operation of the connection portion 6 will be specifically described together with the state when the amount of thermal expansion of the processing containers 31A and 31B is changed by changing the output of the sidewall heater 33.

In FIGS. 8 and 9, (a) shows a state where the temperature of the processing containers 31A and 31B is low, and (b) shows a state where the temperature of the processing containers 31A and 31B is high. For convenience of explanation, FIGS. 8 and 9 show the position where the first processing container 31A is supported by the ball caster 7A, and the position where the second processing container 31B is provided with the height adjusting member 75B. The following describes how the temperature of the processing containers 31A and 31B increases and the amount of thermal expansion increases, that is, how the state shown in (a) of each figure changes to the state shown in (b).

As described above, since the front side of the processing containers 31A and 31B is fixed to the vacuum transfer modules 13 and 14 via the gate valve G, the processing containers 31A and 31B thermally expand with the front side connected to the gate valve G as a base point. That is, the processing containers 31A and 31B thermally expand horizontally and rearward without changing the position of the front end connected to the gate valve G, and the positions of the left and right ends and the rear end of the sidewalls of the processing containers 31A and 31B change outward.

The first processing container 31A and the second processing container 31B are connected by the connection portion 6 having the first block portion 6A, the second block 6B, and the rail portion 63. Accordingly, due to thermal expansion, on the sidewall (right sidewall) on the gap 30 side of the first processing container 31A, the first block portion 6A slides horizontally (rightward) on the rail portion 63, thereby moving toward the second processing container 31B. On the other hand, on the sidewall (left sidewall) on the gap 30 side of the second processing container 31B, the second block portion 6B slides horizontally (leftward) on the rail portion 63, thereby moving toward the first processing container 31A.

(b) of FIG. 8 and (b) of FIG. 9 show a state in which the right sidewall of the processing container 31A and the left sidewall of the second processing container 31B are closer to each other than in (a) of FIG. 8 and (a) of FIG. 9, and the dimension of the gap 30 is reduced. Accordingly, the first block portion 6A is moved to the right and the second block portion 6B is moved to the left.

At this time, the first and second block portions 6A and 6B move so as to be guided by the rail portion 63. Further, as described above, the block portions 6A and 6B slide with the rolling member 62 reducing the friction coefficient with respect to the rail portion 63. For this reason, the positions of the sidewalls of the processing containers 31A and 31B are smoothly moved according to thermal expansion. As a result, thermal expansion of the processing containers 31A and 31B is absorbed by the movement of the positions of the sidewalls in the gap 30, and the fluctuation of the pitch P1 between the centers P of the two stages 32 is suppressed more reliably.

On the other hand, the bottom portion of the first processing container 31A and the second processing container 31B opposite to the gap 30, that is, the left end of the first processing container 31A and the right end of the second processing container 31B are supported by the ball casters 7A and 7B, respectively. Therefore, even if the sidewalls move due to thermal expansion of the processing containers 31A and 31B, the ball portion 72 rotates at the bottom portion of the processing containers 31A and 31B, and the movement of the sidewalls is not restricted. That is, as shown in the left side of (a) and (b) of FIG. 8, the position of the lower surface of the processing container 31A (31B) supported by the ball caster 7A (7B) moves.

Thus, as shown in (a) and (b) of FIG. 9, the left end of the processing container 31A moves to the left and the right end of the processing container 31B moves to the right. Accordingly, due to thermal expansion, although the position of the end portion of the processing containers 31A and 31B on the strut portions 54 side also change, corresponding to this, the positions at which the processing containers 31A and 31B are supported by the ball casters 7A and 7B rapidly change, thereby absorbing the positional change of the end portion of the processing containers, which also suppresses the fluctuation of the pitch P1.

Further, in the height adjusting members 75A and 75B, the through holes 56 formed in the base portions 55A and 55B have an opening diameter greater than the diameter of the height adjusting members 75A and 75B. Accordingly, as shown in the right side of (a) and (b) of FIG. 8, the height adjusting member 75B moves rightward within the through hole 56 as the processing containers 31A and 31B thermally expand. In addition, the height adjusting member 75A which is not shown moves leftward within the through hole 56.

As described above, the first block portion 6A and the second block portion 6B slide with respect to the rail portion 63 and each component of the ball casters 7A and 7B and the height adjusting members 75A and 75B is moved. Accordingly, positional displacement of the sidewalls of the processing containers 31A and 31B due to thermal expansion is absorbed, and fluctuation of the pitch P1 of the stages 32 is suppressed.

Assuming that the left end of the processing container 31A and the right end of the processing container 31B are fixed to the frame 51, the processing container 31A expands to the right from the left end, and the processing container 31B expands to the left from the right end. In this case, the pitch P1 becomes small. However, the left end of the processing container 31A and the right end of the processing container 31B are not fixed to the frame 51 as described above in this configuration, thereby preventing such a reduction in the pitch PT.

In addition, although the center P of the stage 32 moves back and forth due to thermal expansion of the processing containers 31A and 31B, the position of a transfer destination of the transfer mechanism 24 can be adjusted back and forth. Therefore, by appropriately setting the position of the transfer destination, the front and rear positions of the center of the wafer W transferred to the stage 32 and the center P of the stage 32 can be aligned. In this way, the transfer mechanism 24 is set so that the amount of entry from the gate valve G into each of the processing containers 31A and 31B is larger than in the case of non-heating, and then the wafers W are transferred in the substrate processing system 1.

At this time, for example, in order to align the front and rear positions of the transfer mechanism 24, teaching of the transfer mechanism 24 may be performed before processing the wafer W with a desired processing recipe and a transfer position at the time of performing processing with the processing recipe may be determined. In addition, data regarding a correspondence relationship between the transfer position by the transfer mechanism 24 and the output of the sidewall heater 33 may be stored in a memory constituting the controller 100, and the transfer position may be determined based on that data each time the processing recipe is changed and the output of the sidewall heater 33 is also changed.

Here, a case where the amount of thermal expansion of the processing containers 31A and 31B becomes small (the processing containers 31A and 31B thermally contract) will be also briefly described. During thermal contraction, since each component such as the first block portion 6A, the second block portion 6B, the ball casters 7A and 7B, and the height adjusting members 75A and 75B moves in the direction opposite to when the amount of thermal expansion increases, the pitch P1 of the stages 32 does not change as well in this case. Meanwhile, the center P of each stage 32 moves forward compared to before the change in the amount of thermal expansion. Therefore, for the transfer mechanism 24, the position of a transfer destination is set so that the amount of entry from the gate valve G into each of the processing containers 31A and 31B becomes small, and then the wafers W are transferred in the substrate processing system 1.

In this way, by providing the gap 30 and the connection portion 6, fluctuation in the pitch P1 due to thermal expansion and thermal contraction can be suppressed. In addition, by supporting the processing containers 31A and 31B using the connection portion 6, the gap 30 is prevented from bending and tilting downward.

Only the left end of the processing container 31A and only the right end of the processing container 31B are cantilevered on the supporting portion 50. For this reason, in a configuration in which the connection portion 6 is not provided, the processing containers 31A and 31B may be tilted by the gap 30 such that the right side of the processing container 31A and the left side of the processing container 31B are lowered. When the processing containers 31A and 31B are tilted, the transfer position of the wafer W may be displaced between the transfer mechanism 24 and the stage 32, and suppressing the tilt of the processing containers 31A and 31B also leads to suppressing displacement of the transfer position of the wafer W.

In this case, in the configuration of the present disclosure, the lower surface of the cantilevered processing containers 31A and 31B on the other end side is supported by the rail portion 63 via the first and second block portions 6A and 6B. Accordingly, the tilt of the gap 30 between the processing containers 31A and 31B is suppressed, and the processing containers 31A and 31B are stably supported.

Furthermore, in this example, the rib 64 is provided along the lower surface of the rail portion 63. Therefore, the rigidity of the rail portion 63 is improved, and the tilt of the processing containers 31A and 31B can be further suppressed. Furthermore, since the central portion 641 of the rail portion 63 in the rib 64 is formed thicker than the both end portions 642, the rigidity of the central portion 641 can be made higher than that of the both end portions 642 while reducing the weight of the rib 64. Therefore, the rigidity of the central portion of the rail portion 63 to which a large stress is applied is further enhanced, and thus tilt of the gap 30 between the processing containers 31A and 31B can be suppressed and the processing containers 31A and 31B can be supported more stably.

Furthermore, in this example, the first block portion 6A and the second block portion 6B are connected to the processing containers 31A and 31B through the cooling plates 8A and 8B, respectively. Therefore, even when the processing containers 31A and 31B are heated by the sidewall heater 33, the temperature of these block portions 6A and 6B can be maintained at a temperature equal to or lower than the heat resistant temperature (for example, 80° C.). Furthermore, the cooling plates 8A and 8B also serve to improve the strength of the installation surfaces of the block portions 6A and 6B in the processing containers 31A and 31B.

As described above, according to the connected processing container 5, the change in the pitch P1 of the stages 32 is suppressed, and this pitch P1 and the distance between the centers of the wafers W held by the two holders 26 of the transfer mechanism 24 can be maintained in the same state. Therefore, the film formation processing can be performed with the center of each wafer W transferred by the transfer mechanism 24 aligned with the center of the stage 32. As a result, occurrence of problems related to the film quality and film thickness of the TiN film due to positional deviation between the wafer W and the stage 32 is prevented.

The two processing containers 31A and 31B of the connected processing container 5 have a simple structure and are connected by a relatively easily available linear guide (the first block portion 6A, the second block portion 6B, and the rail portion 63). Since the first and second block portions 6A and 6B are fixed to the lower surface of the first and second processing containers 31A and 31B and then the rail portion 63 is attached, the connection portion 6 can be attached without requiring the processing containers 31A and 31B having a special configuration. Therefore, the processing containers 31A and 31B having the connection portion 6 can be easily manufactured.

Furthermore, in the connected processing container 5, the right side of the processing container 31A and the left side of the processing container 31B are not supported, and only the left side of the processing container 31A and the right side of the processing container 31B are supported by the base portions 55A and 55B from below, respectively. Accordingly, as described above, a large space can be formed below the processing container 31A and the processing container 31B, and each component constituting the film forming module 3 can be arranged in the space. Therefore, it is possible to prevent the film forming module 3 and the substrate processing system 1 from becoming large.

Although two wafers W are processed at once in the substrate processing system 1, the wafer W is placed so that the center of the wafer W is aligned with the center P of each stage 32, and processing is performed in the processing containers 31A and 31B separated from each other. Therefore, processing can be performed by applying a processing recipe (processing conditions such as the pressure in the processing container 31, gas flow rate, the temperature of each heater, and the like) used in the single-wafer type film forming apparatus that performs film formation processing on the wafer W one by one. Therefore, it is possible to cut down or reduce the trouble of newly creating or changing the processing recipe for the substrate processing system 1, which is advantageous.

In the above, the present disclosure may be configured such that the first block portion and the second block portion are provided on the upper surface side of each of the first and second processing containers and such that the first and second block portions slidably connected to the rail portion provided above the first and second block portions.

Further, concave portion may be formed in the sidewalls of the first and second processing containers on the gap side, respectively, and the first and second block portions may be provided in the concave portion so as to be fixed to the respective processing containers. In this case, the rail portion is provided so as to straddle the two concave portions, and the first and second block portions are slidably connected to the rail portion.

Further, in the above example, the case where both the first processing container and the second processing container thermally expand or contract has been described. When only one of the processing containers thermally expands or contracts due to some cause, the block portion provided on the one of the processing containers horizontally slides on the rail portion. In this case as well, the center P of the stage of the two processing containers does not move, and thus the fluctuation of the pitch P1 can be suppressed.

Furthermore, when the temperature of vacuum processing performed in the first processing container and the second processing container is lower than the heat resistant temperature of the first and second block portions and the rail portion, it is not always necessary to provide the cooling portion. Further, if the rigidity of the rail portion is ensured, it is not always necessary to provide the rib.

Furthermore, if a movement space is secured on the base portion side, the ball caster may be provided so that the ball comes into contact with the base portion side. Alternatively, the first and second processing containers may be supported by the height adjusting members provided at the base portion without using the ball casters.

Furthermore, in each of the examples described above, although the ball casters 7A and 7B support the left end of the processing container 31A and the right end of the processing container 31B, it may be supported at a position closer to the inside of the processing containers 31A and 31B than these ends. However, in order to secure a sufficiently large space under each of the processing containers 31A and 31B, it is preferable that the side opposite to the side where the gap 30 is provided is supported. The side where the gap 30 is provided is, for example, a position inside the position of the center P of the stage 32 in the horizontal direction (a position near the center of the connected processing container 5), and the side opposite to the side where the gap 30 is provided is, for example, the outside of the position of the center P of the stage 32 in the horizontal direction. That is, it is preferable that the left side of the center P of the processing container 31A is supported by the ball casters 7A, and the right side of the center P of the processing container 31B is supported by the ball casters 7B.

By the way, the connected processing container 5 is not limited to being applied to the film forming module. For example, it can be applied to a module that performs vacuum processing on the wafer W, such as an etching module that supplies an etching gas to etch the wafer W, and an annealing module that heats the wafer W while supplying an inert gas such as nitrogen gas. Further, although the illustrated film forming module 3 is a module that does not perform plasma processing, the connected processing container 5 may be applied to a processing module that performs plasma processing. In the case of performing processing by generating plasma, it is conceivable to perform the processing so as to compensate for a positional deviation between the stage 32 and the wafer W, for example, by adjusting the distribution of the plasma in the plane of the wafer W. However, if plasma is not generated, since such adjustment using plasma cannot be performed, in a module such as the film forming module 3 in which plasma processing is not performed, the effect of the connected processing container 5 of suppressing a positional deviation of the wafer W is particularly effective.

Further, it is conceivable that another substrate processing apparatus may be provided outside the substrate processing system 1, and the processing containers 31A and 31B may be heated and thermally expanded by using the substrate processing apparatus as a heat source. In such a case as well, the connected processing container 5 can prevent the transfer position of the wafer W on the stage 32 from being displaced by. That is, since the above-described effects can be obtained even if the processing containers 31A and 31B are not provided with the heating portion, the processing containers 31A and 31B may not be provided with the heating portion and may perform vacuum processing on the wafer W at room temperature. Furthermore, the number of processing containers constituting the connected processing container is not limited to two, and three or more processing containers may be connected to each other.

It should be considered that the embodiments disclosed this time are illustrative in all respects and not restrictive. The above embodiments may be omitted, substituted, modified or combined in various ways without departing from the scope and spirit of the appended claims.

The invention claimed is:

1. A connected processing container comprising:
   a first processing container and a second processing container arranged side by side in a horizontal direction with a gap therebetween and respectively including a stage to mount a substrate for vacuum processing; and
   a connection portion including:
   a first block portion fixed to the first processing container;
   a second block portion fixed to the second processing container and arranged side by side in the horizontal direction with respect to the first block portion; and
   a rail portion to which the first block portion and the second block portion are slidably connected, the rail portion being provided so as to straddle the first processing container and the second processing container,
   wherein the connection portion is configured to maintain a constant distance between a center of the stage of the first processing container and a center of the stage of the second processing container.

2. The connected processing container of claim 1, wherein the first block portion and the second block portion are provided on the lower surface sides of the first processing container and the second processing container or the upper surface sides of the first processing container and the second processing container.

3. The connected processing container of claim 1, wherein the rail portion is provided with a rib along a surface opposite to a surface on which the first block portion and the second block portion slide.

4. The connected processing container of claim 3, wherein the rib is formed thicker on a central portion of the rail portion corresponding to a region where the gap is formed than on both end portions of the rail portion.

5. The connected processing container of claim 1, wherein the first processing container and the second processing container are heated by a heating portion respectively, and the first block portion and the second block portion are respectively fixed to the first processing container and the second processing container via a cooling portion.

6. The connected processing container of claim 1, comprising a plurality of sets of the first block portion, the second block portion, and the rail portion.

7. The connected processing container of claim 1, further comprising a base portion for supporting each of the first processing container and the second processing container,
   wherein ball casters are interposed between the base portion and the first processing container and between the base portion and the second processing container.

8. The connected processing container of claim 7, wherein a position at which the base portion supports the first processing container via the ball casters and a position at which the base portion supports the second processing container via the ball casters are positions of end portions opposite to the gap when viewed from the first processing container or the second processing container.

9. The connected processing container of claim 7, wherein the first processing container and the second processing container are provided with a rod-shaped height adjusting member for adjusting height position from the base portion,
   an end portion of the height adjusting member on the side of the base portion passes through a through hole having an opening diameter greater than a diameter of the height adjusting member provided in the base portion, and
   the height adjusting member is formed with a feed screw whose height position can be adjusted by positioning nuts.

10. The connected processing container of claim 7, further comprising a plurality of strut portions arranged to surround the first processing container and the second processing container and connected to the base portion supporting the first processing container or the base portion supporting the second processing container.

11. A substrate processing method for collectively transferring and storing substrates in a first processing container and a second processing container arranged side by side in a horizontal direction with a gap therebetween, and performing vacuum processing on each of the substrates mounted by a stage disposed at each of the first processing container and the second processing container, the substrate processing method comprising:
by using a connection portion, which is configured to maintain a constant distance between a center of the stage of the first processing container and a center of the stage of the second processing container, including a first block portion fixed to the first processing container, a second block portion fixed to the second processing container and arranged side by side in the horizontal direction with respect to the first block portion, and a rail portion to which the first block portion and the second block portion are slidably connected, which is provided so as to straddle the first processing container and the second processing container, sliding at least one of the first block portion and the second block portion in the horizontal direction with respect to the rail portion when thermal expansion occurs in each of the first processing container and the second processing container.

* * * * *